(12) United States Patent
Bonilla et al.

(10) Patent No.: US 9,759,766 B2
(45) Date of Patent: Sep. 12, 2017

(54) ELECTROMIGRATION TEST STRUCTURE FOR CU BARRIER INTEGRITY AND BLECH EFFECT EVALUATIONS

(71) Applicant: INTERNATIONAL BUSINESS MACHINES CORPORATION, Armonk, NY (US)

(72) Inventors: Griselda Bonilla, Hopewell Junction, NY (US); Elbert E. Huang, Carmel, NY (US); Chao-Kun Hu, Somers, NY (US); Baozhen Li, South Burlington, VT (US); Paul S. McLaughlin, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/214,782

(22) Filed: Jul. 20, 2016

(65) Prior Publication Data
US 2017/0176514 A1    Jun. 22, 2017

Related U.S. Application Data

(62) Division of application No. 14/973,497, filed on Dec. 17, 2015, now Pat. No. 9,472,477.

(51) Int. Cl.
*H01L 21/66*     (2006.01)
*G01R 31/28*     (2006.01)
*H01L 23/522*    (2006.01)

(52) U.S. Cl.
CPC ..... *G01R 31/2858* (2013.01); *G01R 31/2853* (2013.01); *G01R 31/2884* (2013.01); *H01L 22/14* (2013.01); *H01L 22/30* (2013.01); *H01L 22/32* (2013.01); *H01L 22/34* (2013.01); *H01L 23/5226* (2013.01)

(58) Field of Classification Search
CPC ......... H01L 22/30; H01L 22/32; H01L 22/14; H01L 23/5226; H01L 22/34; G01R 31/2884; G01R 31/2853; G01R 31/2858
See application file for complete search history.

(56) References Cited

U.S. PATENT DOCUMENTS 6,867,056 B1 * 3/2005 Hau-Riege .............. H01L 22/34
                                                          324/71.1

OTHER PUBLICATIONS

Bonilla, Griselda., et al., Pending U.S. Appl. No. 14/973,497 entitled "Electromigration Test Structure for CU Barrier Integrity and Blech Effect Evaluations," filed with the U.S. Patent and Trademark Office on Dec. 17, 2015.
List of IBM Patents or Patent Applications Treated as Related; (Appendix P), Date Filed Jul. 20, 2016; 2 pages.

* cited by examiner

*Primary Examiner* — Fei Fei Yeung Lopez
(74) *Attorney, Agent, or Firm* — Cantor Colburn LLP; Jennifer Anda

(57) ABSTRACT

An electromigration test structure is provided for evaluation of interconnect liner integrity in a semiconductor interconnect structure. The electromigration test structure includes a feeding line; a stress line overlying the feeding line; a first via interconnecting the feeding line and the stress line, wherein the first via comprises a bottom barrier; a first cathode sense and a second cathode sense interconnected to the feeding line; and a first anode sense and a second anode sense interconnected to the feeding line.

4 Claims, 7 Drawing Sheets

A CROSS SECTIONAL VIEW OF THE STRUCTURE

ELECTROMIGRATION TEST STRUCTURE FOR CU BARRIER INTEGRITY AND BLECH EFFECT EVALUATIONS

DOMESTIC PRIORITY

The present application is a DIVISIONAL of U.S. application Ser. No. 14/973,497, filed on Dec. 17, 2015, the contents of which are incorporated herein by reference in its entirety.

BACKGROUND

The present invention relates generally to the manufacture of integrated circuit devices and, more particularly, to a test structure for detecting electromigration voids and determining electromigration failure time and via bottom liner quality in dual Damascene copper interconnects.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual Damascene wiring structures. The wiring structure typically includes copper (Cu), since Cu based interconnects provide higher speed signal transmission between large numbers of transistors on a complex semiconductor chip as compared with aluminum (Al)-based interconnects.

Electromigration is a term referring to the phenomenon of mass transport of metallic atoms (e.g., copper or aluminum) which make up the interconnect material, as a result of electrical current conduction therethrough. More specifically, the electron current collides with the metal ions, thereby pushing them in the direction of electron current travel. Over an extended period of time, the vacated atoms tend to cause void formations typically at one end of a line (i.e. cathode), whereas the accumulation of atoms at the other end (i.e. anode) of the line tends to cause hillock formations. Such deformation degrades line resistance and, in some instances, leads to open circuits, short circuits and device failure. This phenomenon becomes increasingly more significant in integrated circuit design, as relative current densities through metallization lines continue to increase as the linewidth dimensions shrink due to scaling.

In dual Damascene Cu interconnects, electromigration-induced voids can form in either the via portion or the line portion of the dual Damascene structure. However, the root cause(s) of the electromigration voiding may differ, depending upon the specific location of the void. For example, a void located near the bottom of a via usually indicates defects in the via, or perhaps poor coverage of the liner material. On the other hand, voiding in the line may suggest a problem at the interface between the capping layer and the metallization. As a result, it is desirable to pinpoint the failure location, e.g. in order to identify the root cause of electromigration-associated failures, and to modify the fabrication processes for reliability improvement.

In several interconnect structures of the prior art, good liner (i.e. blocking barrier) coverage has been a challenge. This is particularly true in vias with a dual Damascene interconnect structure. Problems associated with poor liner coverage include: (i) early device failure for via depletion electromigration; (ii) early device failure of stress migration with plate above type structures; and (iii) degradation of the Blech effect. This effect, also known as stress-induced backflow effect, was coined after I. Blech, who first reported this phenomenon for aluminum metal lines. The Blech effect can be summarized as follows: as the metal ions move toward the anode end of the metal line, stress build-up occurs opposing the electron flow and slowing down the metal diffusion, thus constraining void growth which can lead to device failure.

Hence in dual Damascene Cu interconnects, the via has often been the weakest link for electromigration, especially for the via depletion mode, i.e., for electrons flowing from a dual Damascene via upwards into a line. The common electromigration failure for this mode is void formation within the via. With technology scaling to 10 nm and beyond, a void in the via needed to cause an electromigration failure becomes smaller, and consequently, the failure time becomes shorter. Such scaling will also lead to an undesirable increase in via resistance. To reduce any resistance increase resulting from scaling, the Cu blocking barrier, i.e. liner, can be made thinner. However, thinning of the liner can decrease the liner's ability to block diffusion of Cu atoms between different metal levels and, consequently, weakening the Blech effect and degrading the electromigration performance. Hence it is desirable to evaluate the integrity of Cu blocking barriers.

The prior art electromigration test structures do not allow evaluation of the block barrier effect at via bottom. For example, several known electromigration test structures have a feeding line that is too large to be sufficiently sensitive for via bottom liner leakage detection and/or does not produce the requisite pushing/driving force for the Cu diffusion as needed in blocking barrier strength testing. Other electromigration test structures in the prior art suffer from the drawback that they cannot detect if electromigration-induced voids form in the feeding line or stress line/via.

There accordingly remains a need for an electromigration test structure for locating electromigration voids, determining electromigration failure time and/or assessing the quality, i.e. strength, of a via bottom liner for blocking Cu diffusion.

SUMMARY

The foregoing discussed drawbacks and deficiencies of the prior art are overcome or alleviated by a method of detecting void locations in a semiconductor interconnect structure comprising an electromigration test structure and an electromigration test structure for interconnect liner integrity evaluation in a semiconductor interconnect structure.

According to an embodiment of the present invention, a method of detecting void locations in a semiconductor interconnect structure comprising an electromigration test structure comprises determining a stress condition by setting a temperature and a current in the electromigration test structure; exposing a wafer, a die or a module to the stress condition; and measuring a resistance to detect an electromigration-induced void.

In another exemplary embodiment, an electromigration test structure for interconnect liner integrity evaluation in a semiconductor interconnect structure includes a feeding line; a stress line overlying the feeding line; a first via interconnecting the feeding line and the stress line, wherein the first via comprises a bottom barrier; a first cathode sense and a second cathode sense interconnected to the feeding line; and a first anode sense and a second anode sense interconnected to the feeding line.

According to an alternative embodiment of the present invention, an electromigration test structure for interconnect liner integrity evaluation in a semiconductor interconnect structure comprises a stress line; a feeding line overlying the stress line; a first via interconnecting the feeding line and the stress line, wherein the first via comprises a bottom barrier; a metal wire; a second via interconnecting the metal wire and the feeding line; a first cathode sense and a second cathode sense interconnected to the feeding line; and a first anode sense and a second anode sense interconnected to the feeding line.

DETAILED DESCRIPTION

Figure 1:
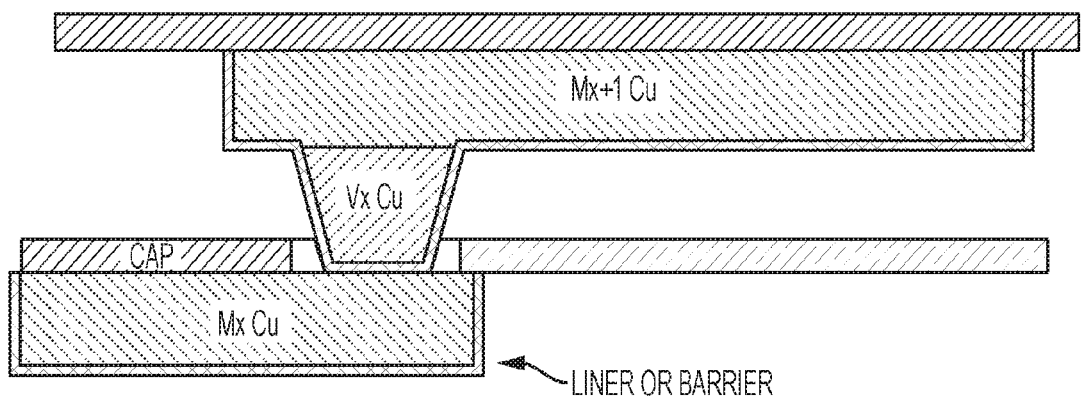
FIG. 1 is a cross sectional view of a dual Damascene Cu interconnect.

Referring initially to FIG. 1, there is shown generally a cross sectional view of a dual Damascene Cu interconnect including a Cu line Mx (i.e. Mx level), a cap, a liner, a via Vx (i.e. Vx level) with a bottom blocking barrier that prevents Cu atom diffusion between Mx and Vx if no leak is present; or, if the barrier is not blocking, i.e. the barrier is permeable, can permit diffusion of Cu atoms between Mx and Vx.

Figure 2:
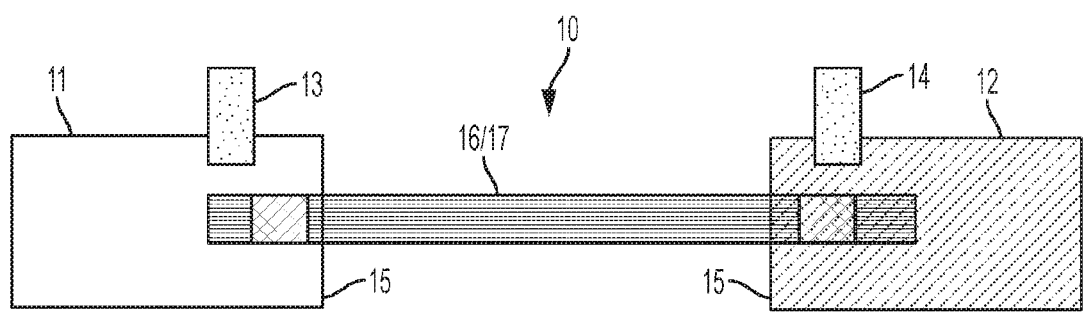
FIG. 2 is a top-down view of a conventional electromigration test structure.

Referring initially to FIG. 2, there is shown an exemplary electromigration test structure 10, as may be commonly found within integrated circuit devices. When an electric current generally passes in structure 10, atoms are driven away from the cathode towards the anode (not shown) due to the momentum transfer from the electrons to the Cu atoms. Due to the blocking boundary imposed by the blocking barrier in Cu dual-Damascene lines, there is an accumulation of atoms at the anode side and, at the same time, atom depletion at the cathode end. Atom accumulation at the anode leads to the development of a compressive stress, while the depletion of atom at the cathode yields a tensile stress. This stress development can result in two distinct failures. If the compressive stress is sufficiently high and the surrounding dielectrics are weak, an extrusion may form, i.e. a metal extrusion, causing short circuits. For ease of illustration, extrusion lines are not shown in the figures. On the other hand, a sufficiently high tensile stress leads to aforementioned void formation, which can grow and span the line or via, so that the line resistance significantly increases and the interconnect fails. Normally, the critical stress for extrusion formation is larger than that for void formation, and the latter is the dominant failure mechanism.

As can be seen in FIG. 2, the electromigration test structure 10 has a pair of vias 15 connecting different levels of Cu line. As a result of a generally unidirectional current traveling therethrough (indicated by the e$^-$ arrow), potentially an electromigration induced void can form at the cathode and/or an extrusion at the anode. In conventional electromigration testing, a technique such as a four-point probe is used to supply a current through the dual Damascene structure 10 through a first pair of probes 11 and 12. A voltmeter is then used to measure the voltage across the structure 10 through a second pair of probes 13 and 14. Through Ohm's law the resistance of the structure 10 is determined, thereby determining the presence of electromigration voids.

However, it will be appreciated that a conventional electromigration test structure 10 is not capable of evaluating the effectiveness of the blocking barrier at the bottom of a via Vx since the feeding line is too large as Cu supplier and/or does not produce the requisite pushing/driving force for the Cu diffusion that is needed in blocking barrier strength testing. In a further drawback, electromigration test structure 10 cannot detect whether an electromigration-induced void forms in the feeding line 16 or stress line/via 17.

Therefore, in accordance with an embodiment of the invention, there is disclosed an electromigration test structure for interconnect liner integrity evaluation in a semiconductor interconnect structure. Said test structure can be used for locating electromigration voids, determining electromigration failure time and/or assessing the quality, e.g. strength, of a via bottom liner for blocking Cu diffusion. In some embodiments, the test structure (a) controls the pushing/driving force jL for Cu diffusion, wherein j stands for current density and L means length, (b) detects if the electromigration void forms in the feeding line and/or stress line/via, and (c) allows for determination of the electromigration failure time and the short length effect (i.e. Blech effect). The electromigration failure time can generally be used to assess the effectiveness of copper diffusion blocking through the via bottom liner.

Figure 3:
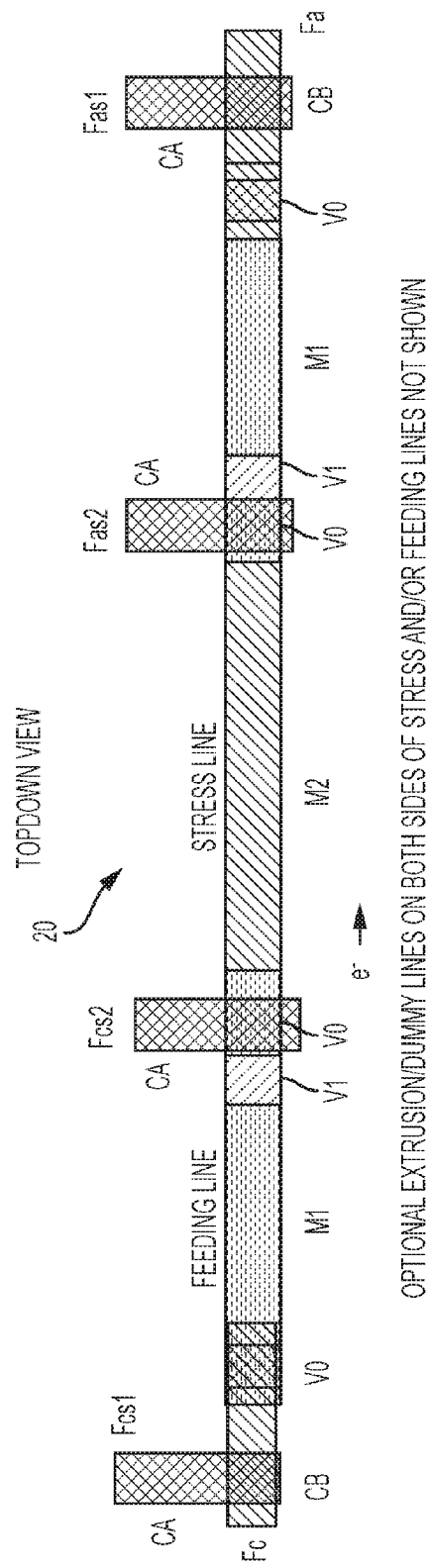
FIG. 3 is a top-down view of an electromigration test structure in accordance with an embodiment of the invention.
Figure 4:
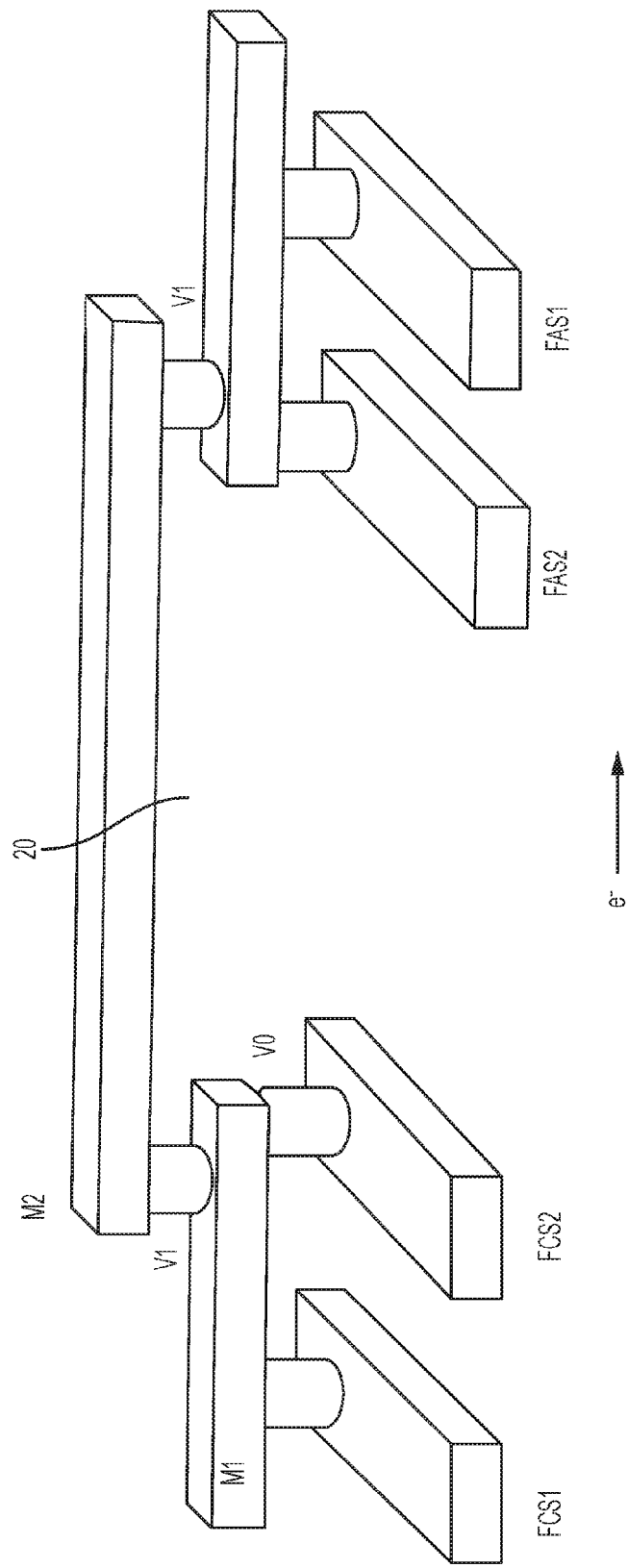
FIG. 4 is a cross-sectional view of the test structure shown in FIG. 3.

Referring now to FIG. 3 and FIG. 4, there is shown a top-down view and cross-sectional view, respectively, of an electromigration test structure 20 in accordance with embodiments of the invention. Test structure 20 includes a stress line M2 disposed above a feeding line M1. Feeding line M1 has a length of 3-10 μm. Stress line M2 has a length of 5-20 μm. Test structure 20 also includes a first anode sense FAS1, a second anode sense FAS2, a first cathode sense FCS1, a second cathode sense FCS2, an anode feeding line Fa, a cathode feeding line Fc, a local interconnect for device connection CA, a local interconnect for device connection CB, a via V0 and a via V1. Via V1 connects feeding line M1 and stress line M2. Via V0 connects local interconnects CA and/or CB to feeding line M1. Local interconnects CA and CB comprise non-Cu refractory metals, e.g. W. Unidirectional current travels through structure 20 as indicated by the e$^-$ arrow, i.e. electrons flow from M1 through V1 to M2, resulting in electromigration-induced voids at the cathode end, with the exact location depending on the liner quality at the V1 bottom. Optional extrusion/dummy lines on either side of the stress and feeding lines are not shown. Said test structure can be used for locating electromigration voids, determining electromigration failure time and/or assessing the quality such as strength of a via bottom liner for blocking Cu diffusion.

Thus configured, structure 20 allows assessing the quality of the V1 bottom barrier, i.e. if it can effectively block the Cu diffusion between feeding line M1 and stress line M2.

Furthermore, the length or width of feeding line M1 can be controlled to adjust the pushing force (jL). Additionally, by controlling the length of feeding line M1 and stress line M2, electromigration failure times can be used to assess the quality of the V1 bottom barrier. For instance, when the V1 bottom barrier is permeable for Cu diffusion, test structure 20 will show stress failure times similar to a regular (i.e. long M1 line) V0/M1 stress, i.e. without short length effect. If the V1 bottom barrier is not permeable for Cu diffusion, it effectively separates the structure into multiple segments in the sense of Cu diffusion, each segment falls into the electromigration short length range, and electromigration failure times will be much longer than a regular V0/M1 case.

As will be appreciated, thus configured, structure 20 allows detection of the location of electromigration-induced voids. Measuring resistance, R, between first cathode sense FCS1 and second cathode sense FCS2 can determine if an electromigration-induced void forms in the feeding line M1. To determine if a void forms in the stressed via (V1) and/or line M2, on the other hand, R is measured between second cathode sense FCS2 and second anode sense FAS2. A void or an extrusion in the anode end of M1 can be detected by measuring R between the second anode sense FAS2 and first anode sense FAS1. Moreover, in the example depicted, overall R can be monitored between first cathode sense FCS1 and first anode sense FAS1.

As those skilled in the art can appreciate, FIG. 3 is an embodiment with one stress segment, stress line M2. In other embodiments, a longer chain includes more segments by repeating the entire test structure of FIG. 3 or parts thereof. In those instances the test structure can be advantageously used to assess additional vias.

Figure 5:
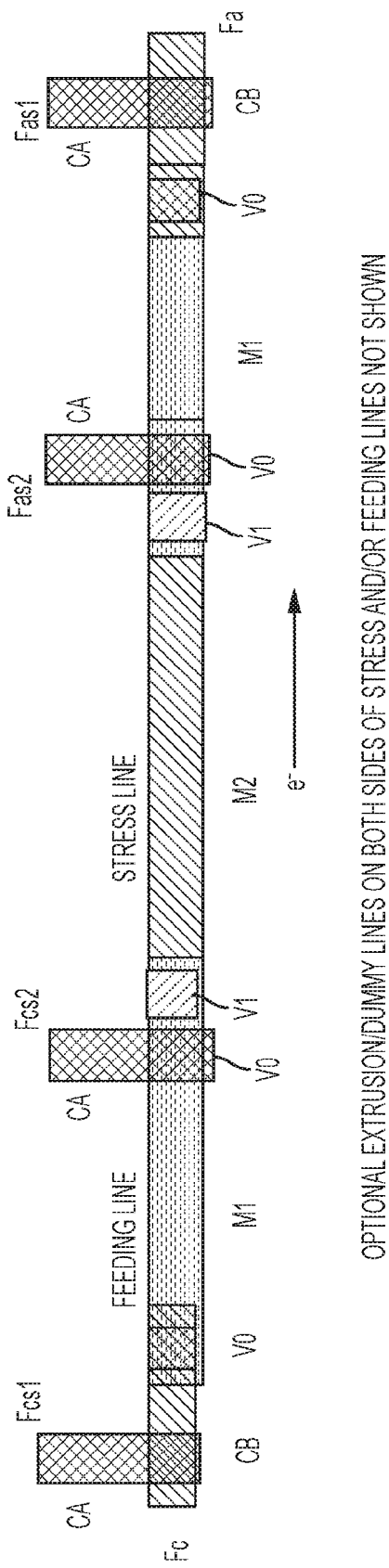
FIG. 5 is a top-down view of an electromigration test structure in accordance with an alternative embodiment of the invention.

In another embodiment, an additional electromigration test structure 30 is provided, as shown in FIG. 5. Said test structure can be used for locating electromigration voids, determining electromigration failure time and/or assessing the strength of a via bottom liner for blocking Cu diffusion. Test structure 30 includes a stress line M2 disposed above a feeding line M1. Feeding line M1 has a length of 3-10 μm. Stress line M2 has a length of 5-20 μm. Test structure 30 also includes a first anode sense FAS1, a second anode sense FAS2, a first cathode sense FCS1, a second cathode sense FCS2, an anode feeding line Fa, a cathode feeding line Fc, a local interconnect for device connection CA, a local interconnect for device connection CB, a via V0 and a via V1. V1 interconnects feeding line M1 and stress line M2. Via V0 connects local interconnects CA and/or CB to feeding line M1. Local interconnects CA and CB comprise non-Cu refractory metals, e.g. W. Unidirectional current travels through structure 30 as indicated by the e⁻ arrow, i.e. electrons flow from M1 to V1 to M2, resulting in electromigration-induced voids at the cathode end. Optional extrusion/dummy lines on either side of the stress and feeding lines are not shown.

Thus configured, structure 30 allows assessing if the V1 bottom barrier can effectively block Cu diffusions between M1 and M2. Furthermore, the length or width of feeding line M1 can be controlled to adjust the pushing force (jL). Additionally, by controlling the length of feeding line M1 and stress line M2, the electromigration failure times can be used to evaluate the effectiveness of the blocking barrier at the V1 bottom for Cu diffusion. For instance, when the V1 bottom barrier is permeable for Cu diffusion, test structure 30 will show stress failure times similar to a regular (i.e. long M1) V0/M1 stress, i.e. without electromigration short length (i.e. Blech) effect. If on the other hand the V1 bottom barrier is a true blocking barrier for Cu diffusions, then each segment falls into the electromigration short length range, and electromigration failure times will be long.

As can be appreciated, structure 30 thus configured allows detection of void locations. By measuring resistance, R, between first cathode sense FCS1 and second cathode sense FCS2, a void formed in the feeding line M1 can be detected. If the void forms in the stressed via V1/line M2, on the other hand, it can be detected by measuring R between second cathode sense FCS2 and second anode sense FAS2. A void or an extrusion in M1, at the anode side, is detected by measuring R between second anode sense FAS2 and first anode sense FAS1. Moreover, in the example depicted, overall resistance R can be monitored between first cathode sense FCS1 and first anode sense FAS1.

Figure 6:
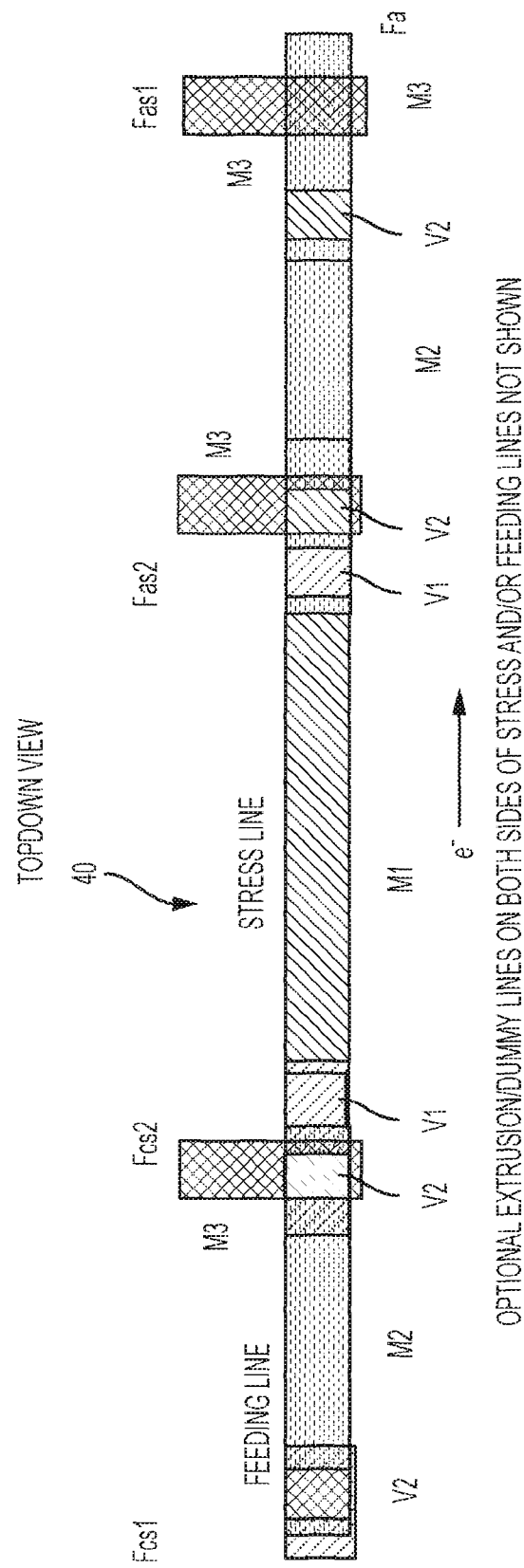
FIG. 6 is a top-down view of an electromigration test structure in accordance with an alternative embodiment of the invention.

In another embodiment, an additional electromigration test structure 40 can be provided, as shown in FIG. 6. Said test structure can be used for locating electromigration voids, determining electromigration failure time and/or assessing the quality, e.g. strength, of a via bottom liner for blocking Cu diffusion. Test structure 40 includes a stress line M1 and a feeding line M2 disposed above stress line M1. Feeding line M2 has a length of 3-10 μm. Stress line M1 has a length of 5-20 μm. Test structure 40 also includes a first anode sense FAS1, a second anode sense FAS2, a first cathode sense FCS1, a second cathode sense FCS2, an anode feeding line Fa, a cathode feeding line Fc, a metal level M3, a via V1 and a via V2. Via V1 connects feeding line M2 and stress line M1. Via V2 interconnects feeding line M2 and metal level M3. Unidirectional current travels through structure 40 as indicated by the e⁻ arrow, i.e. electrons flow from M2 to V1 to M1, resulting in formation of electromigration-induced voids in the cathode end. Optional extrusion/dummy lines on either side of the stress and feeding lines are not shown.

The test structure shown in FIG. 6 can also be used to push the Cu diffusing down-stream from M2 to M1. Generally, the test structures shown in FIG. 4 and FIG. 5 can also be used to push the Cu diffusing up-stream from M1 to M2.

Thus configured, structure 40 allows assessing the quality of the V1 bottom barrier by pushing the Cu diffusion from M2 into V1. Furthermore, the length or width of feeding line M2 can be controlled to adjust the pushing force (jL). Additionally, by controlling the length of feeding line M2 and stress line M1, the electromigration failure times can be used to determine the effectiveness of the blocking barrier for Cu diffusion at V1 bottom. For instance, if the V1 bottom barrier is leaky for Cu diffusion, test structure 40 will show stress similar to a regular (i.e. long M2) V2/M2 stress, i.e. without short length effect. If V1 bottom barrier is not leaky for Cu diffusion, each segment falls into the electromigration short length range, and electromigration failure times will be long.

As can be appreciated, structure 40 thus configured allows detection of void locations. By measuring resistance, R, between first cathode sense FCS1 and second cathode sense FCS2, a void forming in the feeding line M2 can be detected. If a void forms in the stressed via V1/line M1, on the other hand, it can be detected by measuring R between FCS2 and FAS2. A void or an extrusion in M2 at the anode end can be detected by measuring R between first anode sense FAS1 and second anode sense FAS2. Moreover, in the example depicted, overall R can be monitored between first cathode sense FCS1 and first anode sense FAS1.

Figure 7:
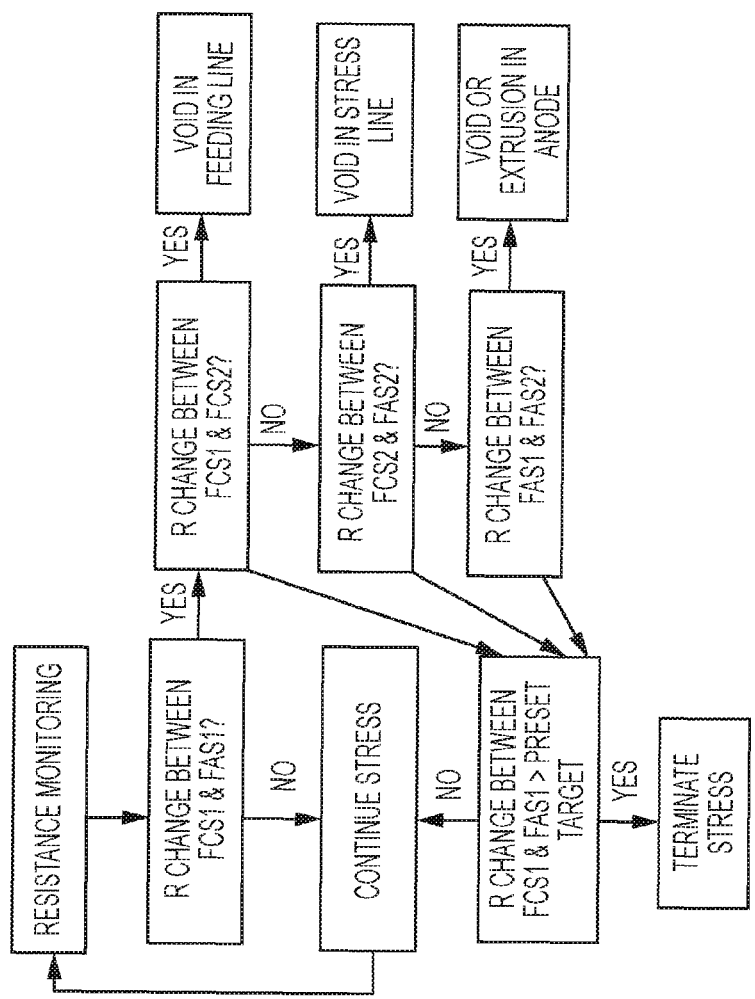
FIG. 7 is a Flow Chart for a method of detecting void locations in a semiconductor interconnect structure comprising the electromigration test structure herein, in accordance with an embodiment of the invention.
Figure 7:
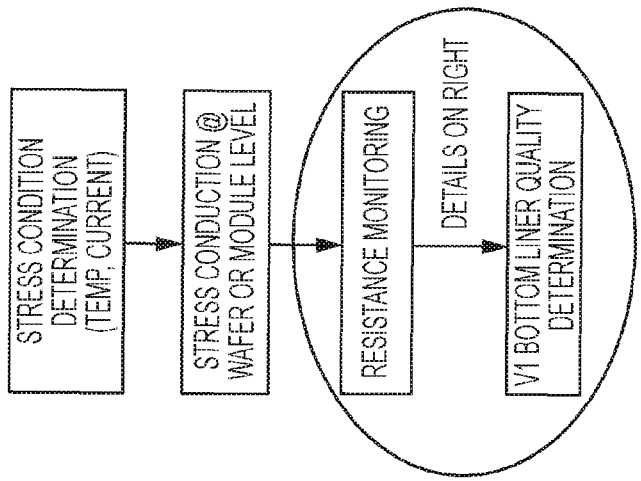

In another embodiment, a method of detecting void locations in a semiconductor interconnect structure comprising the electromigration test structure herein is provided, as shown in FIG. 7. In the flow chart, electromigration test structure 20 as shown in FIG. 3 is used in a method of detecting void locations in a semiconductor interconnect structure, the method comprising the steps of determining a stress condition by setting a temperature and/or current; exposing a wafer, a die (i.e. chip) or a module, i.e. a die in a package, to the stress condition; and measuring a resistance to detect an electromigration-induced void, i.e. its location if said void is detected, optionally an electromigration failure time, and/or quality, i.e. strength, of the V1 bottom barrier.

With respect to monitoring resistance, it allows determining the locations of the void or extrusion. In the example depicted, if resistance is measured, and changes, between the first cathode sense FCS1 and the second cathode sense FCS2, the void is detected in the M1 feeding line. If resistance is measured, and changes, between the second cathode sense FCS2 and the second anode sense FAS2, the void is detected in the V1/stress line M2. If the resistance is measured, and changes, between the first anode sense and the second anode sense, the void is detected in M1 at the anode end. In an alternative embodiment, if the resistance is measured, and changes, between the first anode sense and the second anode sense, an extrusion can be detected in the anode. In an embodiment, leakage between FAS1 or FAS2 to the extrusion monitor lines is used to determine the formation of extrusions (not shown in FIG. 3). Further with respect to the example depicted in FIG. 7, overall resistance is measured between the first cathode sense FCS1 and the first anode sense FAS1.

Electromigration performance can be characterized through the acceleration testing with elevated current and temperature. The stressing current density in the lines can be on the order of j=1-10 MA/cm², and the test temperatures range from 250° C. to 400° C. to ensure a reasonable cycle time. The electromigration failure time $t_f$ can be written as $$t_f = (A/j^n) \cdot \exp(Q_{Cu}/kT)$$

wherein A is a constant, j is the current density, n is the exponent for current acceleration, $Q_{Cu}$ is the activation energy for the electromigration-induced diffusional process, and kT is the thermal energy. It will be appreciated that in a semiconductor interconnect structure, a given wiring segment is not susceptible to electromigration if the product of said segment's current density j and the segment's length L, i.e. the pushing force jL, is less than a process-technology dependent threshold value $(jL)_{Blech}$, which, without wishing to be bound by specific theory, can be obtained from $$jL < (JL)_{Blech} = \Omega \cdot (\Delta \sigma / z^* q \rho)$$

where $\Omega$ is the atomic volume of the wire material (cm³/number), $\Delta\sigma$ is the difference in the hydrostatic stress at both ends of the segment, $z^*$ is the effective charge of the wire's material (a measure of the momentum transfer from electrons to the ions of the wire's material), q is the fundamental electronic charge ($z^*q<0$) and $\rho$ is the electric resistivity of the wire's material.

In embodiments, the methods of the present invention include patterning of a dual Damascene structure in a substrate, e.g., a dielectric layer such as oxide, or any low K dielectric materials. The dual Damascene structure includes a via (for forming a via interconnect) and a trench (for forming an upper wiring layer). In embodiments, the via and the trench is lined with a metal material (aka liner or barrier), e.g., Ta(N), Co(N), etc., and then seeded with a metal layer, e.g., copper or copper alloy. The via and the trench is filled with metals, such as copper by electroplating. In embodiments, a chemical mechanical polishing (CMP) process can be performed on the upper wiring layer to remove the extra copper plated above the trench (aka the over burden). Finally the wiring layer is capped with a dielectric layer (such as SiN or SiCN). Alternatively, a thin metal layer, such as Co, can be deposited at the top copper suffice and then capped with the dielectric layer to enhance electromigration performance.

Through the use of the above-described electromigration test structure embodiments, the location of electromigration-induced voids can advantageously be detected. Further advantageously, the integrity of a Cu blocking barrier at via bottom in dual Damascene wiring structures can be evaluated by (a) controlling, through the feeding line, the pushing/driving force jL for Cu diffusion, b) detecting and/or distinguishing if electromigration-induced voids form in the feeding line and/or stress line/via, and (c) determining the electromigration failure time.

It should also be pointed out that although the test structure embodiments described herein provide additional wire out locations, vias and metallization lines for electromigration testing purposes, it is not necessarily intended for these structures to increase the overall number of signal communication pathways formed within the integrated circuit device. By the same token, however, it is contemplated that such a testing structure could be adapted for an alternative or an additional use than originally intended.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of detecting void locations in a semiconductor interconnect structure comprising an electromigration test structure, the method comprising:
   determining a stress condition by setting a temperature and a current in the electromigration test structure, wherein the test structure comprises first and second feeding line segments; a stress line overlying the first and second feeding line segments; first vias interconnecting the first and second feeding line segments and the stress line, wherein the first vias comprise a bottom barrier; a first cathode sense and a second cathode sense directly connected to the first feeding line segment through respective vias, wherein the first via in the first feeding line segment is intermediate the first and second cathode senses; and a first anode sense and a second anode sense interconnected to the second feeding line segment, and wherein during operation of the test structure, electrons flow from the first feeding line segment to the stress line and to the second feeding line segment;
   exposing a wafer, a die or a module to the stress condition; and
   measuring a resistance to detect an electromigration-induced void.

2. The method of claim 1, wherein the resistance is measured between the first cathode sense and the second cathode sense and the void is detected in the feeding line.

3. The method of claim 1, wherein the resistance is measured between the second cathode sense and the second anode sense and the void is detected in the stress line.

4. The method of claim 1, wherein overall resistance is measured between the first cathode sense and the first anode sense.

\* \* \* \* \*